(12) United States Patent
Li et al.

(10) Patent No.: US 12,306,269 B2
(45) Date of Patent: May 20, 2025

(54) ELECTRICAL FAULT DETECTION AND INTERRUPTION DEVICE AND RELATED ELECTRICAL CONNECTORS AND ELECTRICAL APPLIANCES

(71) Applicant: Chengli Li, Suzhou (CN)

(72) Inventors: Chengli Li, Suzhou (CN); Long Chen, Suzhou (CN); Guolan Yue, Suzhou (CN)

(73) Assignee: Chengli Li, Suzhou (CN)

( * ) Notice: Subject to any disclaimer, the term of this patent is extended or adjusted under 35 U.S.C. 154(b) by 188 days.

(21) Appl. No.: 18/447,206

(22) Filed: Aug. 9, 2023

(65) Prior Publication Data
US 2024/0426940 A1  Dec. 26, 2024

(30) Foreign Application Priority Data

Jun. 21, 2023 (CN) .......................... 202310741456.2
Jun. 21, 2023 (CN) .......................... 202321601756.2

(51) Int. Cl.
*G01R 31/52* (2020.01)
*G01R 31/327* (2006.01)
*H02H 1/00* (2006.01)

(52) U.S. Cl.
CPC ......... *G01R 31/52* (2020.01); *G01R 31/3275* (2013.01); *H02H 1/0015* (2013.01)

(58) Field of Classification Search
CPC .. G01R 31/52; G01R 31/3275; H02H 1/0015; H02H 3/335
USPC ......................................... 324/536, 512, 500
See application file for complete search history.

(56) References Cited

U.S. PATENT DOCUMENTS

| | | | |
|---|---|---|---|
| 7,049,910 B2 * | 5/2006 | Campolo | H02H 3/335 361/42 |
| 2019/0331734 A1 * | 10/2019 | Hanrahan | H02H 3/335 |
| 2024/0097426 A1 * | 3/2024 | Chen | H01H 83/04 |

* cited by examiner

*Primary Examiner* — Giovanni Astacio-Oquendo
(74) *Attorney, Agent, or Firm* — Chen Yoshimura LLP

(57) ABSTRACT

An electrical fault detection and interruption device includes a switch module coupled between input and output ends of current carrying lines, for controlling an electrical connection between the two ends; a signal collection module, for detecting a fault signal on the current carrying lines and converting it to an electrical signal; a signal processing module, for determining whether a fault is present on the current carrying lines based on the electrical signal, and generating an electrical fault signal accordingly; a drive module, for driving the switch module to disconnect the electrical connection between the input and output ends in response to receiving the electrical fault signal; and an alarm module, for generating an alarm signal in response to receive the electrical fault signal. Thus, even when the device malfunctions and loses its protection function, it can still generate an alarm signal to alert the user.

14 Claims, 3 Drawing Sheets

ELECTRICAL FAULT DETECTION AND INTERRUPTION DEVICE AND RELATED ELECTRICAL CONNECTORS AND ELECTRICAL APPLIANCES

BACKGROUND OF THE INVENTION

This invention relates to electrical circuits, and in particular, it relates to an electrical fault detection and protection device, and related electrical connectors and electrical appliances.

With increased safety awareness, more and more consumers install electrical fault detection and protection devices in their homes, such as ground fault circuit interrupter devices (GFCI), arc fault circuit interrupter devices (AFCI), portable residual current protective device (PRCD), or devices with a combination of such protection functions.

However, while many such circuit interrupter devices have a trip function which can disconnect power at the output end in response to a fault condition, they cannot provide protection functions when the device has a malfunction and cannot trip, which causes a hidden safety threat.

SUMMARY OF THE INVENTION

Therefore, there is a need for electrical fault detection and protection devices that can alert the user when they malfunction and lose the tripping (interruption) function.

To solve the above discussed technical problems, an electrical fault detection and interruption device, which includes: a switch module, coupled on the current carrying lines between the input end and the output end, configured to connect or disconnect an electrical connection between the input end and the output end; a signal collection module, configured to detect a fault signal on the current carrying lines and to convert the fault signal to an electrical signal; a signal processing module, coupled to the signal collection module, configured to determine whether a fault is present on the current carrying lines based on the electrical signal, and to generate an electrical fault signal when it is determined that a fault is present on the current carrying lines; a drive module, coupled to the switch module and the signal processing module, configured to receive the electrical fault signal, and to drive the switch module to disconnect the electrical connection between the input end and the output end in response to the electrical fault signal; and an alarm module, coupled to the signal processing module, configured to receive the electrical fault signal, and to generate an alarm signal in response to the electrical fault signal.

In some embodiments, the alarm module includes an auxiliary switch, coupled to the switch module, and configured to turn off the alarm signal when the switch module is reset.

In some embodiments, the alarm module includes an alarm control switch, configured to enable to disable the alarm module.

In some embodiments, the alarm module includes an alarm element configured to generate the alarm signal.

In some embodiments, the alarm element includes one or more of a buzzer, a speaker, an indicator light, and a light emitting element, and wherein the alarm signal includes an audible signal and/or a visible signal.

In some embodiments, the alarm module further includes a first semiconductor element, coupled in series with the alarm element, wherein a control electrode of the first semiconductor element is coupled to the signal processing module, wherein the first semiconductor element is configured to become conductive in response to the electrical fault signal to cause the alarm element to generate the alarm signal.

In some embodiments, the first semiconductor element includes a silicon controlled rectifier, a bipolar junction transistor, a field-effect transistor, or a photoelectric coupler.

In some embodiments, the fault signal on the current carrying lines includes a zero sequence current fault signal, and wherein the signal collection module includes at least one zero sequence current transformer for detecting the zero sequence current fault signal, and wherein the current carrying lines pass through the zero sequence current transformer.

In some embodiments, the electrical fault signal includes an arc fault signal, wherein the signal collection module includes at least one current transformer for detecting the arc fault signal, and wherein at least one of the current carrying lines passes through the current transformer.

In some embodiments, the electrical fault detection and interruption device further includes a monitoring module, coupled to the signal collection module and/or the signal processing module, including a user-operable test switch, configured to generate a simulated fault signal when the test switch is operated to test whether the electrical fault detection and interruption device is functioning normally.

In some embodiments, the electrical fault detection and interruption device further includes a self-test module, coupled to the signal collection module and/or the signal processing module, configured to periodically generate simulated fault signals to test whether the electrical fault detection and interruption device is functioning normally.

In some embodiments, the signal processing module is further configured to process the electrical signal, including at least one of filtering, amplifying, extraction of waveform characteristics, and window gating.

In a second aspect, the present invention provides an electrical power connection device, which includes: a body; and an electrical fault detection and interruption device according to any of the above embodiments, disposed inside the body.

In a second aspect, the present invention provides an electrical appliance, which includes: an electrical load; and an electrical power connection device coupled between a power supply and the electrical load, configured to supply power to the electrical load, wherein the electrical power connection device includes an electrical fault detection and interruption device according to any of the above embodiments.

By employing the alarm module in the electrical fault detection and interruption device, even when the device malfunctions and loses its tripping (interruption) function, the device can still generate an alarm signal to alert the user. This prevents fire and other danger and reduces hidden safety threats, thereby improving the safety of the electrical fault detection and interruption device. Further, the electrical fault detection and interruption devices according to embodiments of the present invention have a simple structure, are low cost and safe.

BRIEF DESCRIPTION OF DRAWINGS

Preferred embodiments of the present invention are described with reference to the drawings. These drawings explain the embodiments and their operating principle, and only illustrate structures that are necessary to the understanding of the invention. These drawings are not to scale. In the drawings, like features are designated by like reference symbols. In the block diagrams, lines between blocks represent electrical or magnetic coupling of the blocks; the absence of lines between blocks does not mean the lack of coupling.

DETAILED DESCRIPTION OF THE INVENTION

Preferred embodiments of the present invention are described below with reference to the drawings. These drawings and descriptions explain embodiments of the invention but do not limit the invention. The described embodiments are not all possible embodiments of the present invention. Other embodiments are possible without departing from the spirit and scope of the invention, and the structure and/or logic of the illustrated embodiments may be modified. Thus, it is intended that the scope of the invention is defined by the appended claims.

Before describing the embodiments, some terms used in this disclosure are defined here to help the reader better understand this disclosure.

In this disclosure, terms such as "connect", "couple", "link" etc. should be understood broadly, without limitation to physical connection or mechanical connection, but can include electrical connection, and can include direct or indirection connections. Terms such as "a" and "one" do not limit the quantity, and refers to "at least one".

In the descriptions below, terms such as "including" are intended to be open-ended and mean "including without limitation", and can include other contents. "Based on" means "at least partly based on." "An embodiment" means "at least one embodiment." "Another embodiment" means "at least another embodiment," etc. In this disclosure, the above terms do not necessarily refer to the same embodiments. Further, the various features, structures, materials or characteristics may be suitably combined in any of the one or more embodiments. Those of ordinary skill in the art may combine the various embodiments and various characteristics of the embodiments described herein when they are not contrary to each other.

Embodiments of the present invention provide an electrical fault detection and interruption device, which includes an alarm module so that when the device malfunctions and loses its tripping (interruption) function, it can still generate an alarm signal to alert the user. This prevents fire and other danger and reduces hidden safety threats, thereby improving the safety of the electrical fault detection and interruption device. Further, the electrical fault detection and interruption devices according to embodiments of the present invention have a simple structure, are low cost and safe.

Figure 1:
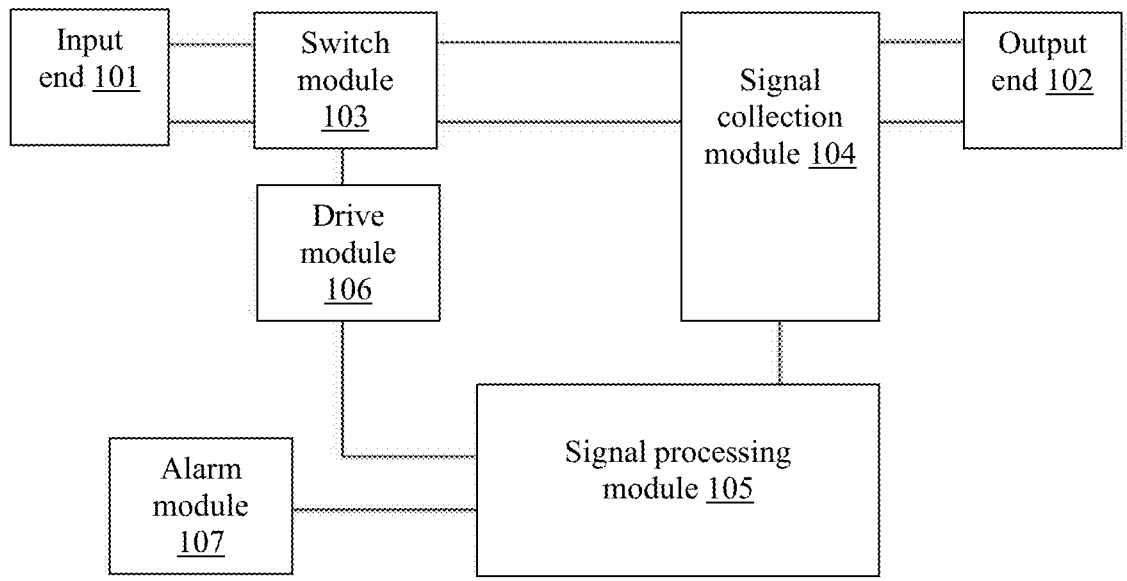
FIG. 1 is a block diagram illustrating an electrical fault detection and interruption device according to some embodiments of the present invention.

FIG. 1 is a block diagram illustrating an electrical fault detection and interruption device according to some embodiments of the present invention. As shown in FIG. 1, the electrical fault detection and interruption device 100 includes a switch module 103, a signal collection module 104, a signal processing module 105, a drive module 106 and an alarm module 107. The switch module 103 is coupled between the input end 101 and output end 102 of the power supply lines, and controls the electrical connection and disconnection btw the input and output ends. The power supply lines may include a first current carrying line (L) coupled to the hot line of the power source, and a second current carrying line (N) coupled to the neutral line of the power source. The signal collection module 104 detects a fault signal on the current carrying lines, and converts the fault signal to an electrical signal for further processing. The signal processing module 105 is coupled to the signal collection module 104, and functions to determine whether an electrical fault is present on the current carrying lines based on the electrical signal, and to generate an electrical fault signal when it determines that an electrical fault is present. The drive module 106 is coupled to the signal processing module 105 and the switch module 103, and functions to drive the switch module 103 to disconnect the power in response to the electrical fault signal. The alarm module 107 is coupled to the signal processing module 105, and generates an alarm signal in response to the electrical fault signal to alert the user of the electrical fault. The electrical faults may be, for example, leakage current fault, arc fault, etc.

The electrical fault detection and interruption device 100 can generate an alarm to alert the user even when the device has a malfunction and loses its tripping function. This prevents fire and other danger and reduces hidden safety threats, thereby improving the safety of the electrical fault detection and interruption device. Further, the electrical fault detection and interruption devices according to embodiments of the present invention have a simple structure, are low cost and safe.

In some embodiments, the alarm module 107 includes an auxiliary switch, coupled to the switch module 103, and configured to turn off the alarm signal when the switch module 103 is reset (i.e. the electrical connection is re-established). In these embodiments, the same auxiliary switch can both assist in resetting the switch module 103 and clear the alarm signal, so that no additional components are required, thereby reducing the space required and saving cost.

In some embodiments, the alarm module 107 includes an alarm control switch, configured to enable or disable the alarm function of the alarm module 107. More specifically, when the alarm function is to be enabled, the user may close the alarm control switch, so that the alarm module 107 is able to receive the electrical fault signal from the signal processing module 105 and generate the alarm signal in response thereto. When the alarm function is to be disabled, the user may open the alarm control switch, so that the alarm module 107 is not able to receive the electrical fault signal from the signal processing module 105 and will not generate the alarm signal. In such embodiments, the user may enable or disable the alarm function based on need, thereby providing flexibility to the user.

In some embodiments, the alarm module 107 includes an alarm element for generating the alarm. The alarm element may be, for example, a buzzer, a speaker, an indicator light, a light emitting element, or other types of alarm elements, or any combinations thereof. The light emitting element may be a light emitting diode (LED). The alarm signal may be audible signal, visible signal, or their combinations. In these embodiments, the electrical fault detection and interruption device can alert the user via the audible and/or visible alarm signals when an electrical fault is detected, reducing hidden danger and improving the safety and reliability of the device.

In some embodiments, the alarm module 107 includes a first semiconductor element, which has its control electrode coupled to the signal processing module 105, and which is coupled in series with the alarm element. The semiconductor element functions to open or close the current path it is coupled in, and may be any one of a silicon controlled rectifier, a bipolar junction transistor, a field-effect transistor, or a photoelectric coupler. When the signal processing module 105 generates an electrical fault signal, the first semiconductor element becomes conductive in response to the electrical fault signal, so that the alarm element generates an alarm signal.

In some embodiments, the electrical fault signal includes a zero sequence current fault signal, and the signal collection module 104 includes at least one zero sequence current transformer for detecting the zero sequence current fault. The current carrying lines pass through the zero sequence current transformer, and when there is a current imbalance on the current carrying lines (i.e. zero sequence current fault), the zero sequence current transformer detects the current imbalance.

In some embodiments, the electrical fault signal includes an arc fault signal, and the signal collection module 104 includes at least one current transformer for detecting the arc fault. The current carrying line passes through the current transformer, and when there is an arc on the current carrying lines (i.e. arc fault), the current transformer detects the arc fault.

In some embodiments, the signal processing module 105 processes the electrical signal received from the signal collection module 104. The processing may include at least one of filtering, amplifying, extraction of waveform characteristics, and window gating. For example, when the fault signal collected by the signal collection module 104 is an arc fault signal, the signal processing module 105 filters the electrical signal which has been converted from the arc fault signal, outputs a filtered signal which is a characteristic current signal in the frequency range of the arc, amplifies the filtered signal, extracts arc characteristics from the amplified signal to generate an arc characteristics signal, generates an arc pulse signal based on the arc characteristics signal (i.e. it converts the arc characteristics signal to the arc pulse signal which has a certain duty cycle), records the number of pulses in the arc pulse signal within a defined length of time, and generates the arc fault signal based on the number of pulses within the defined length of time. Further, the signal processing module 105 blocks out the arc characteristics signal or the arc pulse signal during one or more predefined time intervals in each period of the AC power supply current and keeps these signals during other time intervals of each AC period where arcs are more likely to occur, so as to improve the accuracy of the arc detection. In some other embodiments, the signal collection module 104 may perform certain pre-processing, such as filtering, of the fault signal it collects before outputting it to the signal processing module 105.

Figure 2:
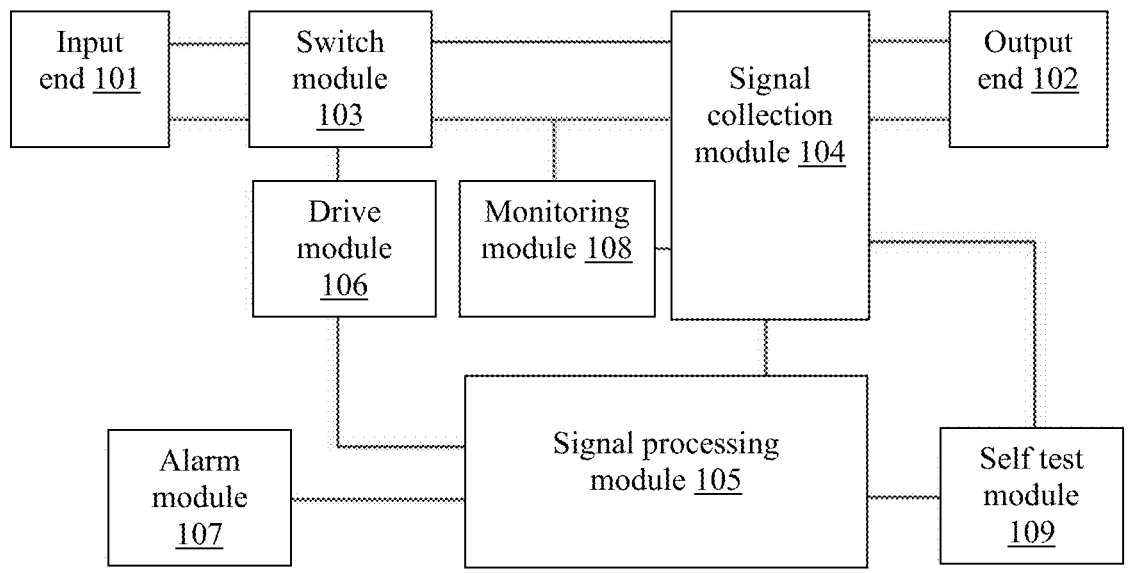
FIG. 2 is a block diagram illustrating an electrical fault detection and interruption device according to some other embodiments of the present invention.

FIG. 2 is a block diagram illustrating an electrical fault detection and interruption device according to some other embodiments of the present invention. Compared to the device shown in FIG. 1, the electrical fault detection and interruption device 200 of FIG. 2 further includes a monitoring module 108 and a self-test module 109. The switch module 103, signal collection module 104, signal processing module 105, drive module 106 and alarm module 107 are similar to those of the device of FIG. 1 and detailed descriptions are omitted here.

In some embodiments, the monitoring module 108 is coupled to the signal collection module 104, and includes a user-operable test switch. When the test switch is operated by the user, the monitoring module 108 generates a simulated fault signal, to test whether the electrical fault detection and interruption device is functioning normally. When it is functioning normally, i.e., the electrical fault detection and interruption device 200 has proper electrical fault detection and interruption function, the signal collection module 104 collects the simulated fault signal, and based thereon, the signal processing module 105 determines that a fault has occurred and generates an electrical fault signal. In response to the electrical fault signal, the drive module 106 drives the switch module 103 to disconnect the electrical connection between the input end 101 and the output end 102, and the alarm module 107 generates an alarm signal. On the other hand, if the switch module 103 does not disconnect the electrical connection between the input and output ends and/or the alarm module 107 does not generate an alarm signal when the test switch is operated, it indicates to the user that the electrical fault detection and interruption device 200 has lost its electrical fault detection and interruption function. In some other embodiments, the monitoring module 108 may be coupled to the signal processing module 105.

In some embodiments, the self-test module 109 is coupled to the signal collection module 104 and the signal processing module 105. The self-test module 109 periodically generates simulated fault signals to test whether the electrical fault detection and interruption device is functioning normally. When it is functioning normally, i.e., the electrical fault detection and interruption device 200 has proper electrical fault detection and interruption function, the signal collection module 104 collects the simulated fault signals, and the signal processing module 105 determines that a fault has occurred and generates a self-test fault signal. The self-test fault signal drives a self-test turn-off module (e.g. a semiconductor element) to turn off the simulated fault signal. On the other hand, if the signal collection module 104 and/or signal processing module 105 malfunctions, then the signal processing module 105 cannot generate the self-test fault signal, and therefore cannot drive the self-test turn-off module to turn off the simulated fault signal. As a result, the simulated fault signal continues, and after a predefined time period, it triggers the drive module 106 to drive the switch module 103 to disconnect the electrical connection between the input end 101 and output end 102.

Figure 3:
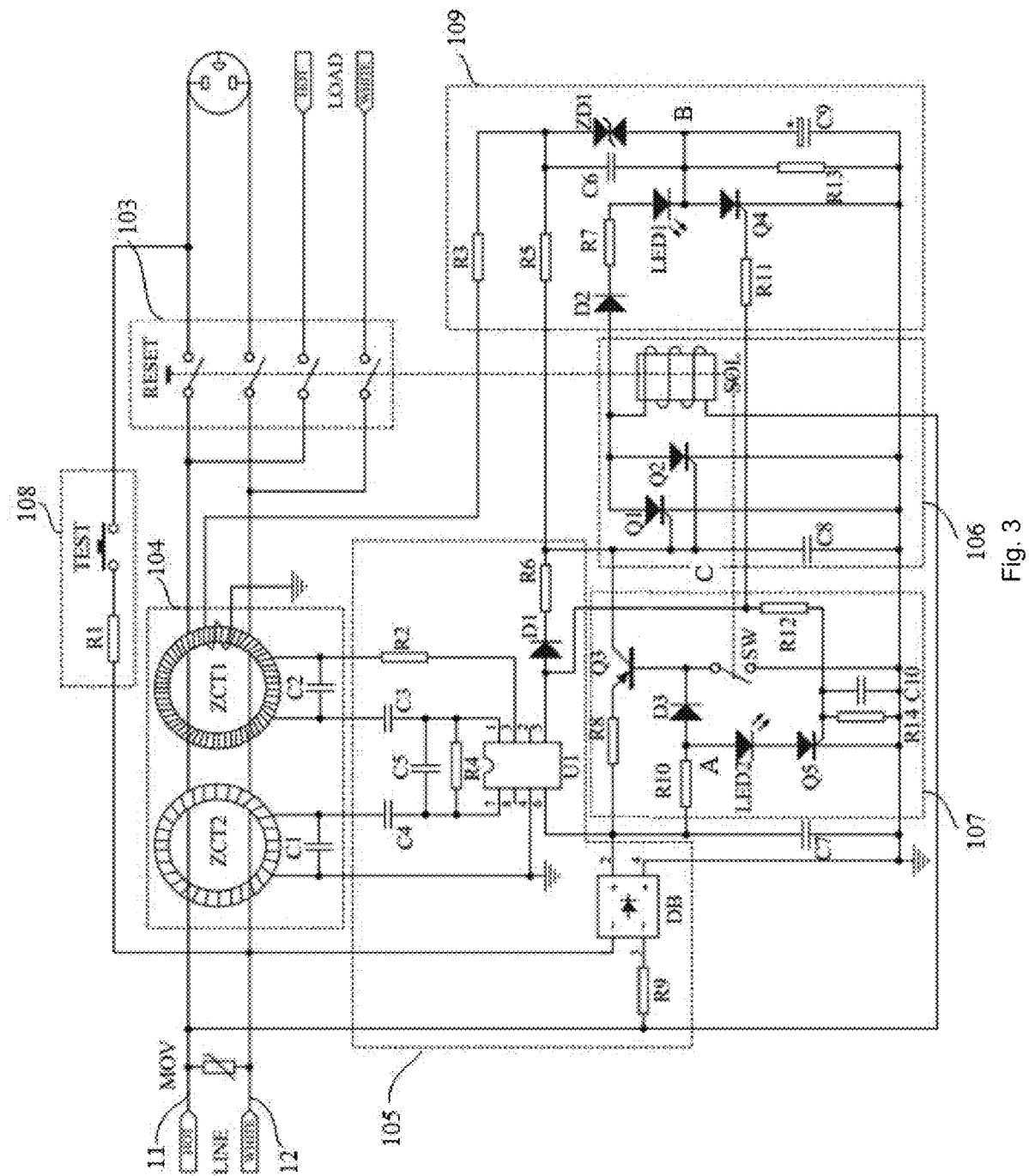
FIG. 3 is a circuit diagram of an electrical fault detection and interruption device according to a first embodiment of the present invention.

FIG. 3 is a circuit diagram of an electrical fault detection and interruption device according to a first embodiment of the present invention.

As shown in FIG. 3, the electrical fault detection and interruption device 300 is coupled between the input end LINE and an electrical load LOAD. It includes a switch module 103, a signal collection module 104, a signal processing module 105, a drive module 106, an alarm module 107, a monitoring module 108 and a self-test module 109. The current carrying lines include a first current carrying line L (HOT) 11 and a second current carrying line N (WHITE) 12. In this embodiment, the electrical fault is a zero sequence current fault, and the signal collection module 104 includes two zero sequence current transformers ZCT1 and ZCT2. The first current carrying line 11 and the second current carrying line 12 pass through the transformers. The switch module 103 includes a reset switch RESET, configured to control the electrical connection of the current carrying lines. The signal processing module 105 includes a leakage current detection chip U1 and its peripheral circuits. The drive module 106 includes a switch driving element (such as a solenoid SOL), two silicon controlled rectifiers Q1 and Q2, and a capacitor C8. The alarm module 107 includes an auxiliary switch SW, a silicon controlled rectifier Q5 (first semiconductor element), a light emitting diode LED2 (alarm element) coupled in series with the silicon controlled rectifier Q5, and peripheral circuits. The auxiliary switch SW is mechanically linked to the reset switch RESET. The monitoring module 108 includes a resistor R1 and a test switch TEST coupled in series. The self-test module 109 includes a silicon controlled rectifier Q4, a voltage regulator (Zener diode) ZD1, a capacitor C9, and peripheral circuits.

When the electrical fault detection and interruption device 300 performs zero sequence current detection, the reset switch RESET is closed. When the currents on the first current carrying line 11 and second current carrying line 12 are balanced, the zero sequence current transformer ZCT1 does not generate an imbalance current. When a zero sequence current fault is present on the first current carrying line 11 or second current carrying line 12, the zero sequence current transformer ZCT1 detects the zero sequence current fault and generates a corresponding induced signal. The zero sequence current transformer ZCT1 is coupled to pins 1 and 3 of the leakage current detection chip U1, to input the induced signal to the leakage current detection chip U1. When the zero sequence fault current signal is above a predefined threshold, pin 5 of the leakage current detection chip U1 outputs a high voltage level (electrical fault signal), otherwise it outputs a low voltage level. The high voltage level at pin 5 is coupled to the control electrodes of silicon controlled rectifiers Q1 and Q2 via diodes D1 and resistor R6, triggering the silicon controlled rectifiers to become conductive. As a result, a large current flows through the solenoid SOL, generating a magnetic force to drive the reset switch RESET to disconnect the electrical connection between the input and output ends. Meanwhile, the high voltage level at pin 5 of the leakage current detection chip U1 is also coupled to the control electrode of silicon controlled rectifier Q5 via resistor R12, triggering silicon controlled rectifier Q5 to become conductive and remain conductive. As a result, a current flows through light emitting diode LED2, so that it emits a light signal (alarm signal) to alert the user that a zero sequence current fault has occurred. Because the high voltage level at pin 5 is coupled to both the drive module 106 and the alarm module 107, if the electrical fault detection and interruption device 300 malfunctions (e.g., the drive module 106 malfunctions) and the tripping function is lost, i.e., the device cannot disconnect the electrical connection between the input and output ends, the alarm module 107 can still generate the alarm signal to alert the user.

When performing reset, the user manually depresses the reset switch RESET. By the linked mechanical structure, when the reset switch RESET is depressed, the auxiliary switch SW is also closed. However, the downward movement of the reset switch RESET is blocked by a metal plate (blocking plate) in the trip mechanism. Because the auxiliary switch SW is closed, the voltage level of the upper end of the light emitting diode LED2 (i.e. point A) becomes low (as it is grounded via diode D3), so the current no longer flows through the light emitting diode LED2 and silicon controlled rectifier Q5, and the light emitting diode LED2 is extinguished. On the other hand, the closing of the auxiliary switch SW also causes silicon controlled rectifier Q3 to become conductive, triggering silicon controlled rectifier Q1 and/or Q2 to become conductive. As a result, a large current flows through the solenoid SOL, generating a magnetic force to move away the metal plate (blocking plate) that was blocking the downward movement of reset switch RESET, so that the reset switch RESET, which is still being depressed by the user, can continue to move downwards to a locked position, i.e., reset is now complete. At this time, when the user releases the reset switch RESET, the auxiliary switch SW becomes open. Thus, in this embodiment, the same auxiliary switch SW both assists the reset switch RESET to reset and clears the alarm signal. This simplifies the circuit structure, reduces the space required, and lowers cost.

Moreover, the electrical fault detection and interruption device 300 of FIG. 3 allows testing of the zero sequence current fault protection function and/or the alarm function. The test is performed when the reset switch RESET is closed. The user manually closes the test switch TEST of the monitoring module 108, and a current path 11-R1-12 is formed, which generates a simulated zero sequence current fault signal. The zero sequence current transformer ZCT1 detects the zero sequence current fault signal, generates a corresponding induced signal and inputs it to the leakage current detection chip U1. When the zero sequence current fault signal is above a predefined threshold value, the leakage current detection chip U1 outputs a high voltage level (electrical fault signal) at its pin 5. This signal is coupled to the control electrodes of silicon controlled rectifiers Q1 and Q2, triggering Q1 and/or Q2 to become conductive. As a result, a large current flows through the solenoid SOL, generating a magnetic force to drive the reset switch RESET to disconnect the electrical connection between the input and output ends. Meanwhile, the high voltage level at pin 5 is also coupled to the control electrode of silicon controlled rectifier Q5, triggering it to become conductive, so that light emitting diode LED2 emits light. In other words, if in response to the test switch TEST being closed, the switch module 103 disconnects the electrical connection between the input and output ends and light emitting diode LED2 emits a light signal, it indicates that the both the zero sequence current fault protection function and the alarm function of the electrical fault detection and interruption device 300 are normal. On the other hand, if in response to test switch TEST is closed, the switch module 103 does not disconnect the electrical connection between the input and output ends, but the light emitting diode LED2 emits a light, it indicates that the zero sequence current fault protection function of the electrical fault detection and interruption device 300 is lost due to malfunction of one or more of the signal collection module 104, signal processing module 105 and drive module 106. If the switch module 103 does disconnect the electrical connection between the input and output ends, but light emitting diode LED2 does not emit a light, it indicates that the alarm function of the electrical fault detection and interruption device 300 is lost due to malfunction of the alarm module 107. If the switch module 103 does not disconnect the electrical connection between the input and output ends, and light emitting diode LED2 does not emit a light, it indicates that both the zero sequence current fault protection function and the alarm function are lost due to malfunction of one or more of the signal collection module 104, signal processing module 105, drive module 106 and alarm module 107. Therefore, by using the monitoring module 108 to test the zero sequence current fault protection function and the alarm function, the user can discover malfunction of the electrical fault detection and interruption device 300 and timely replace the device.

Further, the electrical fault detection and interruption device 300 of FIG. 3 has a self-test function. The first current carrying line 11 charges capacitor C9 via a current path formed by SOL-D2-R7-LED1. After a certain time period, the voltage level at the upper end of capacitor C9 (point B) exceeds the trigger voltage of Zener diode ZD1, so Zener diode ZD1 becomes conductive, a simulated zero sequence current fault signal is generated via resistor R3. The zero sequence current transformer ZCT1 detects the zero sequence current fault signal and generates a corresponding induced signal, which is input to the leakage current detection chip U1. The leakage current detection chip U1 outputs a high voltage level at its pin 5 (self-test fault signal), which is coupled to the control electrode of the silicon controlled rectifier Q4 (self-test turn-off element), triggering it to be conductive. Capacitor C9 is discharged via silicon controlled rectifier Q4, so the voltage at its upper end rapidly decreases to a level below the trigger voltage of Zener diode ZD1. As a result, Zener diode ZD1 is off and the simulated zero sequence current fault signal is no longer generated, and pin 5 of leakage current detection chip U1 now outputs a low voltage level. This process (from start to end of the simulated zero sequence current fault signal generation) repeats itself periodically. The process occurs in a very short time period; by appropriately setting the capacitance of capacitor C8, the voltage level at the upper end of capacitor C8 (point C) increases slowly during this process, insufficient to trigger silicon controlled rectifiers Q1 and Q2 to become conductive, and therefore does not affect the normal function of the electrical fault detection and interruption device 300. On the other hand, if the signal collection module 104 and/or signal processing module 105 malfunctions, then pin 5 of leakage current detection chip U1 does not output the high voltage level. As a result, silicon controlled rectifier Q4 remains non-conductive, capacitor C9 continues to trigger Zener diode ZD1 to conduct, and the current through resistor R5 continuously charges capacitor C8. The voltage across capacitor C8 continuously increases, and when it exceeds a certain level, silicon controlled rectifiers Q1 and Q2 are triggered to conduct. This causes a large current to flow through the solenoid SOL, generating a magnetic force to drive the reset switch RESET to disconnect the electrical connection between the input and output ends. It also causes light emitting diode LED1 to emit light, alerting the user that the electrical fault detection and interruption device 300 malfunctioned and needs to be replaced.

Figure 4:
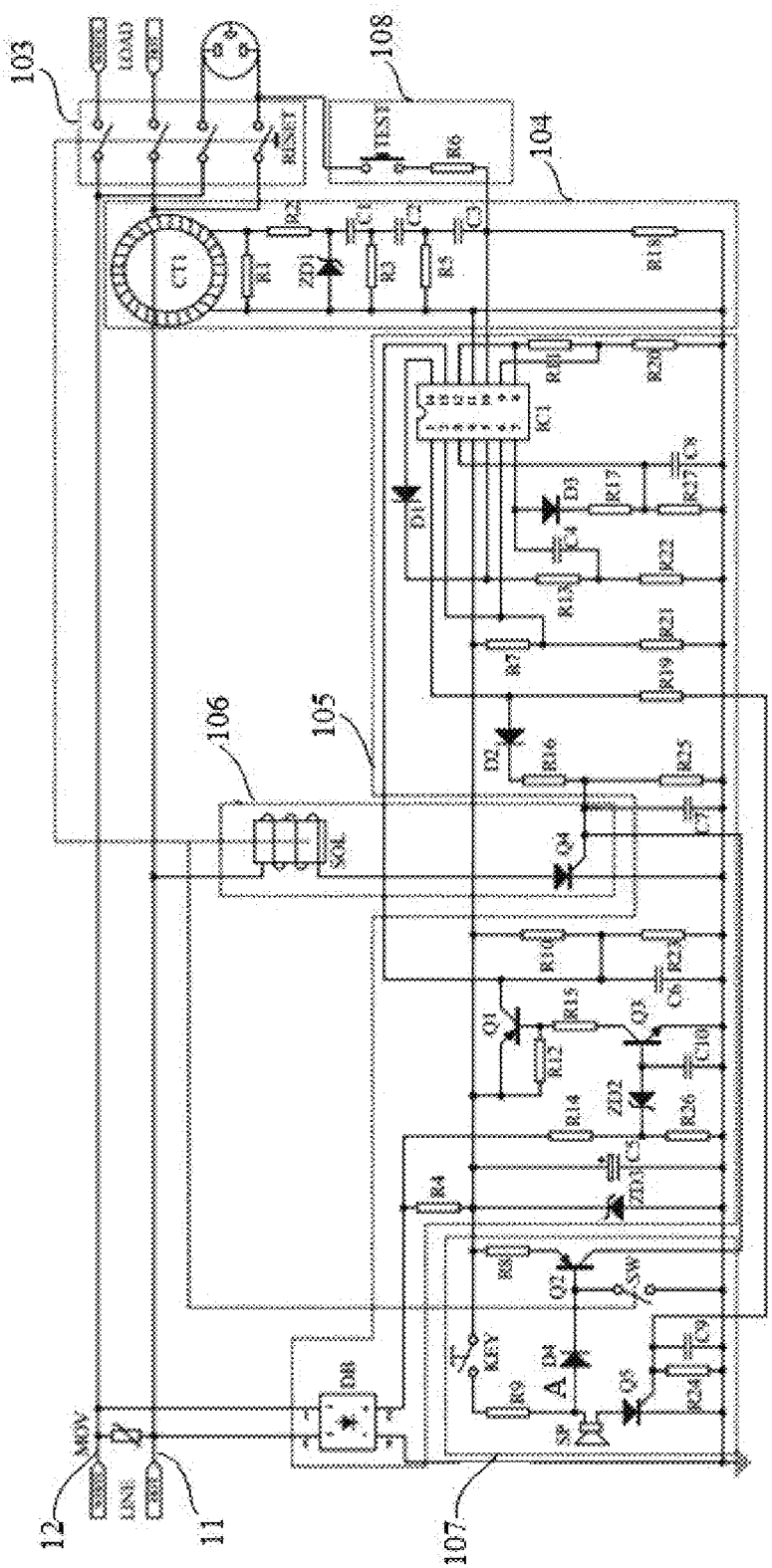
FIG. 4 is a circuit diagram of an electrical fault detection and interruption device according to a second embodiment of the present invention.

FIG. 4 is a circuit diagram of an electrical fault detection and interruption device according to a second embodiment of the present invention.

As shown in FIG. 4, the electrical fault detection and interruption device 400 is coupled between the input end LINE and an electrical load LOAD. It includes a switch module 103, a signal collection module 104, a signal processing module 105, a drive module 106, an alarm module 107, and a monitoring module 108. The current carrying lines include a first current carrying line L (HOT) 11 and a second current carrying line N (WHITE) 12. In this embodiment, the electrical fault is an arc fault, and the signal collection module 104 includes a current transformer CT1 through which the first current carrying line 11 passes. The switch module 103 includes a reset switch RESET, configured to control the electrical connection of the current carrying lines. The signal processing module 105 includes an arc detection chip IC1, an amplifier circuit, a window gating circuit, and other peripheral circuits. The drive module 106 includes a switch driving element (such as a solenoid SOL) and a silicon controlled rectifier Q4. The alarm module 107 includes an auxiliary switch SW, an alarm control switch KEY, a silicon controlled rectifier Q5 (first semiconductor element), a speaker SP (alarm element) coupled in series with the silicon controlled rectifier Q5, and peripheral circuits. The auxiliary switch SW is mechanically linked to the reset switch RESET. The monitoring module 108 includes a resistor R6 and a test switch TEST coupled in series.

When the electrical fault detection and interruption device 400 performs an arc detection, the reset switch RESET is closed. When an arc fault is present on the current carrying lines, the current transformer CT1 detects the arc fault signal, and converts it to a secondary current signal, which is converted to a secondary voltage signal by the parallel coupled resistor R1. This signal is filtered by the filter circuit formed by capacitors C1, C2, C3 and resistors R2, R3, and R5, so that the voltage waveform in the frequency range of arcs is preserved. The Zener diode ZD1 voltage-regulates the filtered voltage waveform. The window gating circuit selects the voltage signal within predefined time intervals of the AC periods. Based on the gated voltage signal, the arc detection chip IC1 determines whether the arc fault is a harmful arc fault. If it is a harmful arc fault, the arc detection chip IC1 outputs a high voltage level (electrical fault signal) at its pin 1; otherwise, it outputs a low voltage level at pin 1. The high voltage level at pin 1 of arc detection chip IC1 is coupled to the control electrode of silicon controlled rectifier Q4 via diode D2 and resistor R16, which triggers silicon controlled rectifier Q4 to become conductive. As a result, a large current flows through the solenoid SOL, generating a magnetic force to drive the reset switch RESET to disconnect the electrical connection between the input and output ends. Meanwhile, the high voltage level at pin 1 is also coupled to the control electrode of silicon controlled rectifier Q5. If the alarm control switch KEY of the alarm module 107 is closed, i.e., the alarm function is enabled, then the high voltage level at pin 1 triggers silicon controlled rectifier Q5 to become conductive and remain conductive. As a result, a current flows through speaker SP, which generates an audible signal (alarm signal) to alert the user that an arc fault has occurred. When this alarm function is not desired, the user may open the alarm control switch KEY to disable the alarm function of the alarm module 107. Because the high voltage level at pin 1 of arc detection chip IC1 is coupled to both the drive module 106 and the alarm module 107, if the electrical fault detection and interruption device 400 malfunctions (e.g., the drive module 106 malfunctions) and the tripping function is lost, i.e., the device cannot disconnect the electrical connection between the input and output ends, the alarm module 107 can still generate the alarm signal to alert the user.

When performing reset, the user manually depresses the reset switch RESET. By the linked mechanical structure, when the reset switch RESET is depressed, the auxiliary switch SW is also closed. However, the downward movement of the reset switch RESET is blocked by a metal plate (blocking plate) in the trip mechanism. Because the auxiliary switch SW is closed, the voltage level of the upper end of the speaker SP (i.e. point A) becomes low (as it is grounded via diode D4), so the current no longer flows through the speaker SP and silicon controlled rectifier Q5, and the speaker SP no longer generates an audible signal. On the other hand, the closing of the auxiliary switch SW also causes the silicon controlled rectifier Q2 to become conductive, triggering silicon controlled rectifier Q4 to become conductive. As a result, a large current flows through the solenoid SOL, generating a magnetic force to move away the metal plate (blocking plate) that was blocking the downward movement reset switch RESET, so that the reset switch RESET, which is still being depressed by the user, can continue to move downwards to a locked position, i.e., reset is now complete. At this time, when the user releases the reset switch RESET, the auxiliary switch SW becomes open. Thus, in this embodiment, the same auxiliary switch SW both assists the reset switch RESET to reset and clears the alarm signal. This simplifies the circuit structure, reduces the space required, and lowers cost.

Moreover, the electrical fault detection and interruption device 400 of FIG. 4 allows testing of the arc fault protection function and/or the alarm function. The test is performed when the reset switch RESET and alarm control switch KEY are closed. The user manually closes the test switch TEST of the monitoring module 108, so a simulated arc fault signal is generated from the first current carrying line 11 via resistor R6, and is coupled to pin 10 of arc detection chip IC1. The arc detection chip IC1, along with its peripheral components, processes the simulated arc fault signal and determines that it is a harmful arc fault, and outputs a high voltage level (electrical fault signal) at its pin 1. This signal is coupled to the control electrodes of silicon controlled rectifier Q4, triggering it to become conductive. As a result, a large current flows through the solenoid SOL, generating a magnetic force to drive the reset switch RESET to disconnect the electrical connection between the input and output ends. Meanwhile, the high voltage level at pin 1 is also coupled to the control electrode of silicon controlled rectifier Q5, triggering it to become conductive, so that speaker SP generates an audible signal. In other words, if in response to the user closing the test switch TEST, the switch module 103 disconnects the electrical connection between the input and output ends, and speaker SP generates an audible signal, then it indicates that the both the arc fault protection function and the alarm function of the electrical fault detection and interruption device 400 are normal. On the other hand, if in response to test switch TEST being closed, the switch module 103 does not disconnect the electrical connection between the input and output ends, but speaker SP generates an audible signal, it indicates that the arc fault protection function of the electrical fault detection and interruption device 400 is lost due to malfunction of one or more of the signal collection module 104, signal processing module 105 and drive module 106. If the switch module 103 does disconnect the electrical connection between the input and output ends, but speaker SP does not generate an audible signal, it indicates that the alarm function of the electrical fault detection and interruption device 400 is lost due to malfunction of the alarm module 107. If the switch module 103 does not disconnect the electrical connection between the input and output ends, and speaker SP does not generate an audible signal, it indicates that both the arc fault protection function and the alarm function are lost due to malfunction of one or more of the signal collection module 104, signal processing module 105, drive module 106 and alarm module 107. Therefore, by using the monitoring module 108 to test the arc fault protection function and the alarm function, the user can discover malfunction of the electrical fault detection and interruption device 400 and timely replace the device.

In a second aspect, additional embodiments of the present invention provide an electrical power connection device, which includes a body and an electrical fault detection and interruption device according to any one of the above embodiments disposed inside the body.

In a third aspect, additional embodiments of the present invention provide an electrical appliance, which includes an electrical load, and an electrical power connection device coupled between a power supply and the load to supply power to the load, where the electrical power connection device employs an electrical fault detection and interruption device according to any one of the above embodiments.

While the present invention is described above using specific examples, these examples are only illustrative and do not limit the scope of the invention. It will be apparent to those skilled in the art that various modifications, additions and deletions can be made to the electrical fault detection and interruption device of the present invention without departing from the spirit or scope of the invention.

The invention claimed is:

1. An electrical fault detection and interruption device, comprising:
   a plurality of current carrying lines having an input end and an output end;
   a switch module, coupled on the current carrying lines between the input end and the output end, configured to connect or disconnect an electrical connection between the input end and the output end;
   a signal collection module, configured to detect a fault signal on the current carrying lines and to convert the fault signal to an electrical signal;
   a signal processing module, coupled to the signal collection module, configured to determine whether a fault is present on the current carrying lines based on the electrical signal, and to generate an electrical fault signal when it is determined that a fault is present on the current carrying lines;
   a drive module, coupled to the switch module and the signal processing module, configured to receive the electrical fault signal, and to drive the switch module to disconnect the electrical connection between the input end and the output end in response to the electrical fault signal; and
   an alarm module, coupled to the signal processing module, configured to receive the electrical fault signal, and to generate an alarm signal in response to the electrical fault signal.

2. The electrical fault detection and interruption device of claim 1, wherein the alarm module includes an auxiliary switch, coupled to the switch module, and configured to turn off the alarm signal when the switch module is reset.

3. The electrical fault detection and interruption device of claim 1, wherein the alarm module includes an alarm control switch, configured to enable to disable the alarm module.

4. The electrical fault detection and interruption device of claim 1, wherein the alarm module includes an alarm element configured to generate the alarm signal.

5. The electrical fault detection and interruption device of claim 4, wherein the alarm element includes one or more of a buzzer, a speaker, an indicator light, and a light emitting element, and wherein the alarm signal includes an audible signal and/or a visible signal.

6. The electrical fault detection and interruption device of claim 4, wherein the alarm module further includes a first semiconductor element, coupled in series with the alarm element, wherein a control electrode of the first semiconductor element is coupled to the signal processing module, wherein the first semiconductor element is configured to become conductive in response to the electrical fault signal to cause the alarm element to generate the alarm signal.

7. The electrical fault detection and interruption device of claim 6, wherein the first semiconductor element includes a silicon controlled rectifier, a bipolar junction transistor, a field-effect transistor, or a photoelectric coupler.

8. The electrical fault detection and interruption device of claim 1, wherein the fault signal on the current carrying lines includes a zero sequence current fault signal, and wherein the signal collection module includes at least one zero sequence current transformer for detecting the zero sequence current fault signal, and wherein the current carrying lines pass through the zero sequence current transformer.

9. The electrical fault detection and interruption device of claim 1, wherein the electrical fault signal includes an arc fault signal, wherein the signal collection module includes at least one current transformer for detecting the arc fault signal, and wherein at least one of the current carrying lines passes through the current transformer.

10. The electrical fault detection and interruption device of claim 1, further comprising:
a monitoring module, coupled to the signal collection module and/or the signal processing module, including a user-operable test switch, configured to generate a simulated fault signal when the test switch is operated to test whether the electrical fault detection and interruption device is functioning normally.

11. The electrical fault detection and interruption device of claim 1, further comprising:
a self-test module, coupled to the signal collection module and/or the signal processing module, configured to periodically generate simulated fault signals to test whether the electrical fault detection and interruption device is functioning normally.

12. The electrical fault detection and interruption device of claim 1, wherein the signal processing module is further configured to process the electrical signal, including at least one of filtering, amplifying, extraction of waveform characteristics, and window gating.

13. An electrical power connection device, comprising:
a body; and
an electrical fault detection and interruption device of claim 1, disposed inside the body.

14. An electrical appliance, comprising:
an electrical load; and
an electrical power connection device coupled between a power supply and the electrical load, configured to supply power to the electrical load, wherein the electrical power connection device includes an electrical fault detection and interruption device of claim 1.

* * * * *